(12) United States Patent
Espiritu et al.

(10) Patent No.: US 9,035,440 B2
(45) Date of Patent: May 19, 2015

(54) INTEGRATED CIRCUIT PACKAGING SYSTEM WITH A LEAD AND METHOD OF MANUFACTURE THEREOF

(75) Inventors: Emmanuel Espiritu, Singapore (SG); Elizar Andres, Singapore (SG); Henry Descalzo Bathan, Singapore (SG); Zigmund Ramirez Camacho, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 815 days.

(21) Appl. No.: 13/167,458

(22) Filed: Jun. 23, 2011

(65) Prior Publication Data
US 2012/0326285 A1 Dec. 27, 2012

(51) Int. Cl.
*H01L 21/56* (2006.01)
*H01L 23/495* (2006.01)
*H01L 21/48* (2006.01)
*H01L 23/00* (2006.01)
*H01L 23/31* (2006.01)

(52) U.S. Cl.
CPC .... *H01L 23/49548* (2013.01); *H01L 23/49503* (2013.01); *H01L 23/49582* (2013.01); *H01L 21/4832* (2013.01); *H01L 24/48* (2013.01); *H01L 2224/48247* (2013.01); *H01L 2224/73265* (2013.01); *H01L 2924/01327* (2013.01); *H01L 2224/32257* (2013.01); *H01L 23/3107* (2013.01); *H01L 24/49* (2013.01); *H01L 2224/2919* (2013.01)

(58) Field of Classification Search
USPC ........... 257/676, E21.502, E23.031; 438/124, 438/127
See application file for complete search history.

(56) References Cited

U.S. PATENT DOCUMENTS

| | | | |
|---|---|---|---|
| 5,486,721 A | 1/1996 | Herklotz et al. | |
| 6,245,448 B1 | 6/2001 | Abbott | |
| 7,060,535 B1 * | 6/2006 | Sirinorakul et al. | 438/123 |
| 7,064,008 B2 | 6/2006 | Abbott et al. | |
| 7,939,378 B2 | 5/2011 | Abbott et al. | |
| 2006/0278961 A1 * | 12/2006 | Gai | 257/667 |
| 2009/0230526 A1 | 9/2009 | Chen et al. | |

* cited by examiner

*Primary Examiner* — Marc Armand
(74) *Attorney, Agent, or Firm* — Ishimaru & Associates LLP

(57) ABSTRACT

A method of manufacture of an integrated circuit packaging system includes: forming a package paddle; forming a lead adjacent to the package paddle; depositing a lead conductive cap on the lead, the lead conductive cap includes a nickel layer having a thickness between 2.55 μm to 8.00 μm deposited on the lead, a palladium layer deposited on the nickel layer, and a gold layer deposited on the palladium layer; mounting an integrated circuit over the package paddle; attaching an electrical connector between the lead conductive cap and the integrated circuit; and forming an encapsulation over the integrated circuit, a portion of the lead, and a portion of the package paddle.

20 Claims, 3 Drawing Sheets

INTEGRATED CIRCUIT PACKAGING SYSTEM WITH A LEAD AND METHOD OF MANUFACTURE THEREOF

TECHNICAL FIELD

The present invention relates generally to an integrated circuit packaging system, and more particularly to a system with a lead.

BACKGROUND ART

Semiconductor chips have become progressively more complex, driven in large part by the need for increasing processing power. Increase in power is needed in a smaller chip size for compact or portable electronic devices such as cell phones, smart phones, personal media systems, ultraportable computers.

There are a number of conventional processes for packaging integrated circuit (IC) dice. By way of example, many IC packages utilize a metallic leadframe that has been stamped or etched from a metal sheet to provide electrical interconnects to external devices. The die may be electrically connected to the leadframe by means of bonding wires, solder bumps or other suitable electrical connections.

In response to the smaller chip size, packaging technologies have evolved, for example, to enable an increased lead density, which can reduce the footprint area of a package mounted on a printed circuit board (PCB). Some packaging technologies may enable this increased lead density by providing rows of leads connected to a disposable portion of a leadframe.

However, manufacturing processes for such leadframes may not be scalable. As lead density requirements further increase, it may be desirable to use packaging technologies that are more scalable in terms of lead density.

Moreover, it may be desirable to further reduce package size in additional ways. At the same time, it may be desirable to maintain sufficient structural integrity and to facilitate surface mounting of the package to a PCB. It may also be desirable to formulate a packaging process designed to meet these objectives. Current packaging solutions can meet some of these objectives but may not be able to meet most, or all, of these objectives.

Thus, a need still remains for an integrated circuit packaging system with increased density and structural integrity. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a package paddle; forming a lead adjacent to the package paddle; depositing a lead conductive cap on the lead, the lead conductive cap includes a nickel layer having a thickness between 2.55 µm to 8.00 µm deposited on the lead, a palladium layer deposited on the nickel layer, and a gold layer deposited on the palladium layer; mounting an integrated circuit over the package paddle; attaching an electrical connector between the lead conductive cap and the integrated circuit; and forming an encapsulation over the integrated circuit, a portion of the lead, and a portion of the package paddle.

The present invention provides an integrated circuit packaging system, including: a package paddle; a lead adjacent to the package paddle; a lead conductive cap on the lead, the lead conductive cap includes a nickel layer having a thickness between 2.55 µm to 8.00 µm deposited on the lead, a palladium layer deposited on the nickel layer, and a gold layer deposited on the palladium layer; an integrated circuit over the package paddle; an electrical connector attached between the lead conductive cap and the integrated circuit; and an encapsulation over the integrated circuit, a portion of the lead, and a portion of the package paddle.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
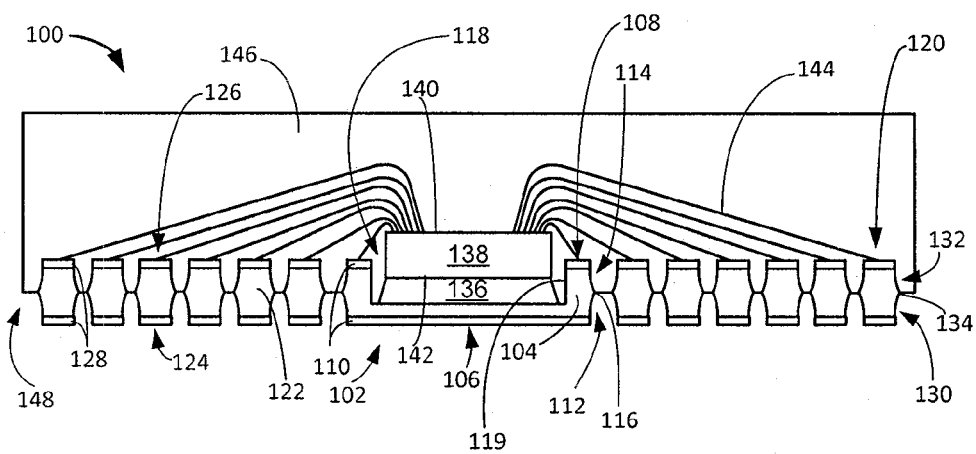
FIG. 1 is a cross-sectional view of an integrated circuit packaging system taken along line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGS. Similarly, although the views in the drawings for ease of description generally show similar orientations, this depiction in the FIGS. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane of the active surface of the integrated circuit, regardless of its orientation. The term "vertical" refers to a direction perpendicular to the horizontal as just defined. The term "non-horizontal" refers to any angle between horizontal including vertical as previously defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Figure 2:
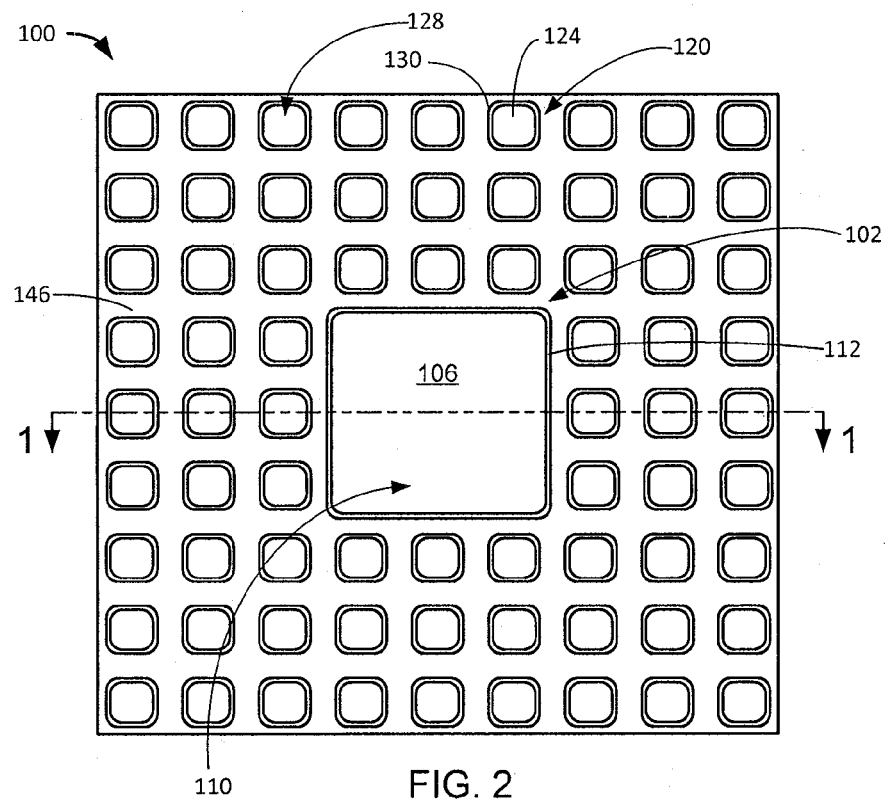
FIG. 2 is a bottom view of the integrated circuit packaging system.

Referring now to FIG. 1, therein is shown a cross-sectional view of an integrated circuit packaging system 100 taken along line 1-1 of FIG. 2 in a first embodiment of the present invention. The integrated circuit packaging system 100 can include a multi-row quad flat no leads (QFN) leadframe with an optimum plating thickness range for the leads and paddle.

The integrated circuit packaging system 100 can include a package paddle 102, which is defined as a support structure for mounting a semiconductor device thereon. For example, the package paddle 102 can include a die paddle or a platform for mounting an integrated circuit device.

The package paddle 102 can include a paddle body 104, which is defined as an interior or non-peripheral portion of the package paddle 102. The paddle body 104 can be formed with copper, metal alloys, or other conductive materials. The paddle body 104 can include a paddle bottom side 106 and a paddle top side 108 opposite to the paddle bottom side 106. The paddle bottom side 106 and the paddle top side 108 are defined as a lower extent and an upper extent, respectively, of the paddle body 104.

The package paddle 102 can include a paddle conductive cap 110, which is defined as a conductive structure composed of layers that can include nickel (Ni), palladium (Pd), and gold (Au). The paddle conductive cap 110 can include:

A nickel thickness between 2.55 µm-8.00 µm.
A palladium thickness between 0.020 µm-0.152 µm.
A gold thickness of at least 0.003 µm.

The paddle conductive cap 110 can be deposited onto the paddle bottom side 106 and onto the paddle top side 108 of the paddle body 104. The paddle conductive cap 110 can be deposited using plating, sputtering, or chemical vapor deposition (CVD). The paddle conductive cap 110 can be formed directly on portions of surfaces of the paddle body 104 at the paddle bottom side 106 and the paddle top side 108. The paddle body 104 and the paddle conductive cap 110 can form a pre-plated leadframe (PPF).

The paddle body 104 can include a paddle recess 118, which is defined as a region having less thickness and without the paddle conductive cap 110 that is formed from the paddle top side 108 for mounting a semiconductor device. The paddle recess 118 can be formed by etching or stamping. The paddle body 104 can include non-horizontal sidewalls 119 formed by the paddle recess 118 in the paddle body 104. The non-horizontal sidewalls 119 of the paddle recess 118 can be perpendicular to the paddle bottom side 106.

The paddle body 104 can include a paddle lower concave side 112 and a paddle upper concave side 114 above the paddle lower concave side 112. The paddle lower concave side 112 is defined as a non-horizontal side of the paddle body 104 with a curved surface extended from the paddle bottom side 106. The paddle upper concave side 114 is defined as a non-horizontal side of the paddle body 104 with a curved surface extending from the paddle top side 108.

The paddle body 104 can include a paddle ridge 116, which is defined as a lateral protrusion on the paddle body 104 that is formed at the intersection of the paddle lower concave side 112 and the paddle upper concave side 114. The paddle ridge 116 can be formed between the paddle bottom side 106 and the paddle top side 108.

The integrated circuit packaging system 100 can include a lead 120, which provides electrical connectivity to next system levels. For example, the lead 120 can provide electrical connectivity to a next system level device such as a printed circuit board (PCB).

The lead 120 can include a lead body 122, which is defined as an interior or non-peripheral portion of the lead 120. The lead body 122 can be formed with copper, metal alloys, or other conductive materials. The lead body 122 can be formed from a metal sheet through stamping or etching. The lead body 122 can include a lead bottom side 124 and a lead top side 126 opposite to the lead bottom side 124. The lead bottom side 124 and the lead top side 126 are a lower extent and an upper extent, respectively, of the lead body 122.

The lead 120 can include a lead conductive cap 128, which is defined as a conductive structure composed of layers that can include nickel (Ni), palladium (Pd), and gold (Au). The lead conductive cap can include:

A nickel thickness between 2.55 µm-8.00 µm.
A palladium thickness between 0.020 µm-0.152 µm.
A gold thickness of at least 0.003 µm.

The lead conductive cap 128 can be deposited on the lead using plating, sputtering, and CVD. The lead conductive cap 128 can be deposited at the lead bottom side 124 and the lead top side 126. Nickel can be deposited on the lead body 122 and palladium can be deposited on the nickel. Gold can be deposited on the palladium.

The lead conductive cap 128 can be formed directly on portions of surfaces of the lead body 122 at the lead bottom side 124 and the lead top side 126. The lead 120 and the lead conductive cap 128 can form a pre-plated leadframe (PPF).

The lead body 122 can include a lead lower concave side 130 and a lead upper concave side 132 above the lead lower concave side 130. The lead lower concave side 130 is defined as a non-horizontal side of the lead body 122 with a curved surface extending from the lead bottom side 124. The lead upper concave side 132 is defined as a non-horizontal side of the lead body 122 with a curved surface extending from the lead top side 126.

The lead body 122 can include a lead ridge 134, which is defined as a lateral protrusion on the lead 120 that is formed at the intersection of the lead lower concave side 130 and the lead upper concave side 132. The lead ridge 134 can be formed between the lead bottom side 124 and the lead top side 126.

The integrated circuit packaging system 100 can include an attach layer 136, which is defined as an adhesive layer for attaching a semiconductor device to the package paddle 102. For example, the attach layer 136 can be a tape, bonding agent, glue, or an adhesive.

The integrated circuit packaging system 100 can include an integrated circuit 138, which is a semiconductor device having active circuitry fabricated thereon, attached to the paddle body 104 with the attach layer 136. The integrated circuit 138 can be mounted within the paddle recess 118. For illustrative purposes, the integrated circuit 138 is shown as a wirebond integrated circuit, although it is understood that the integrated circuit 138 can be any other semiconductor device such as a flip chip.

The integrated circuit 138 can include an active side 140 and an inactive side 142 opposite the active side 140. The active side 140 is defined as a side of the integrated circuit 138 having the active circuitry fabricated thereon. The inactive side 142 is defined as the side opposite to the active side 140 with no active circuitry fabricated thereon. The inactive side 142 of the integrated circuit can be attached to the attach layer 136.

The integrated circuit packaging system 100 can include an electrical connector 144, which electrically connects the lead 120 and the integrated circuit 138. The electrical connector 144 can be electrically coupled to the lead conductive cap 128 at the lead top side 126 and to the active side 140 of the integrated circuit 138. The electrical connector 144 can be coupled to a peripheral portion of the integrated circuit 138 at the active side 140.

The electrical connector 144 can be electrically coupled to the paddle conductive cap 110 at the paddle top side 108 and to the active side 140 of the integrated circuit 138. The integrated circuit packaging system 100 can include any number of the electrical connector 144 connected to a similar number of the lead 120.

The integrated circuit packaging system 100 can include an encapsulation 146, which is defined as a package body for the semiconductor package for sealing semiconductor devices and providing mechanical and environmental protection. For example, the encapsulation 146 can be an epoxy molding compound or a ceramic material. The encapsulation 146 can be formed over or on the lead top side 126, the lead upper concave side 132, the paddle top side 108, the paddle upper concave side 114, the integrated circuit 138, the attach layer 136, and the electrical connector 144.

The encapsulation 146 can expose the package paddle 102 and the lead 120 at the paddle bottom side 106 and the lead bottom side 124, respectively. The encapsulation 146 can include an encapsulation bottom side 148, which is a lower extent of the encapsulation 146. The encapsulation bottom side 148 can be formed at the paddle ridge 116 and the lead ridge 134.

The integrated circuit packaging system 100 with a nickel thickness between 2.55 µm-8.00 µm was compared to a prior art package system in a series of board level reliability tests. The prior art package system had a nickel thickness below 2.55 µm.

In a board level drop test, four boards with the integrated circuit packaging system and four boards with the prior art package system were subjected to thirty test drops. The purpose of the drop test was to establish confidence in the solder attachments between the packaged devices and the PCB board using the JESD22-B111 standard.

Units of the prior art package system failed as early as the first test drop and none of the units passed the test criteria after fifteen test drops. The drop test results for the integrated circuit packaging system 100 showed that all four boards passed the test criteria after thirty test drops.

The integrated circuit packaging system 100 and the prior art package system were also subjected to cyclic bending tests and thermal cycling tests. In the cyclic bending tests, the integrated circuit packaging system 100 showed an improvement of forty percent over the prior art packaging system in solder joint reliability. For thermal cycling tests, the integrated circuit packaging system 100 was projected to double reliability over prior art packaging systems.

It has been discovered that the lead conductive cap 128 and the paddle conductive cap 110 with a nickel thickness between 2.55 µm-8.00 µm provides a stronger junction for improving board-level reliability (BLR) cyclic bending performance by forty percent over prior art packaging systems. The discovery of the range of nickel between 2.55 µm-8.00 µm prevents a total alteration of pure nickel during conductive adhesive reflow resulting in a residual pure nickel region that forms a less brittle connection that resists various tests without breaking.

Further, it has been discovered that the lead conductive cap 128 and the paddle conductive cap 110 with a nickel thickness between 2.55 µm-8.00 µm passes thirty drop tests whereas prior art packaging systems fail after the first drop test.

Referring now to FIG. 2, therein is shown a bottom view of the integrated circuit packaging system 100. The integrated circuit packaging system 100 can include the package paddle 102 adjacent and surrounded by a number of the lead 120. The lead 120 can be arranged in an array surrounding the package paddle 102. The package paddle 102 can include the paddle lower concave side 112 and the paddle bottom side 106. The paddle bottom side 106 can include the paddle conductive cap 110.

The lead 120 can be formed in a number of rows surrounding and spaced from the package paddle 102. The lead 120 can be electrically isolated from the package paddle 102. The lead 120 can include the lead lower concave side 130. The lead 120 can include the lead conductive cap 128.

For illustrative purposes, the paddle bottom side 106 and the paddle lower concave side 112 are each shown with a shape of a square, although it is understood that the paddle bottom side 106 and the paddle lower concave side 112 can include any other shapes. Also for illustrative purposes, the lead bottom side 124 and the lead lower concave side 130 are each shown with a shape of a square, although it is understood that the lead bottom side 124 and the lead lower concave side 130 can include any other shapes.

The integrated circuit packaging system 100 can include the encapsulation 146 formed between the package paddle 102 and the lead 120 and between the lead 120 and another of the lead 120. The encapsulation 146 can expose the paddle bottom side 106, the paddle lower concave side 112, the lead bottom side 124, and the lead lower concave side 130.

Figure 3:
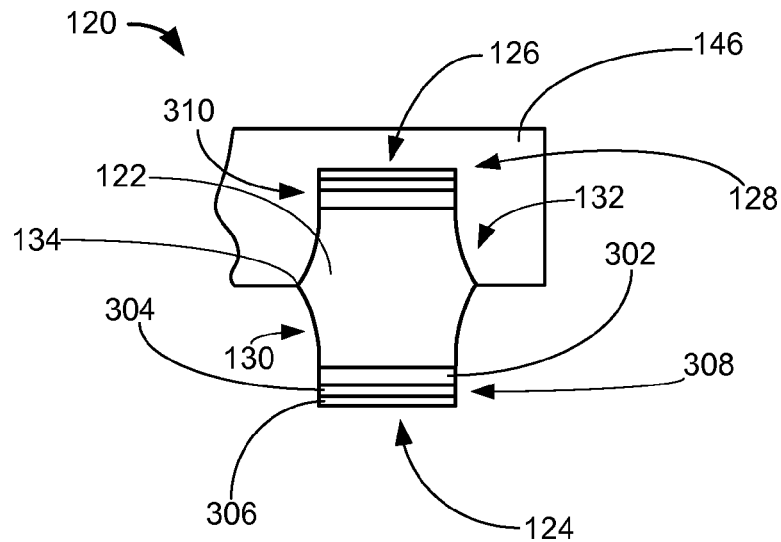
FIG. 3 is a detailed cross-sectional view of the lead.

Referring now to FIG. 3, therein is shown a detailed cross-sectional view of the lead 120. The lead 120 can be partially embedded within the encapsulation 146. The lead 120 can include the lead conductive cap 128 at the lead bottom side 124 and at the lead top side 126 of the lead body 122. The lead conductive cap 128 can include a nickel layer 302, a palladium layer 304, and a gold layer 306.

The nickel layer 302 is defined as a layer of pure nickel that can compose a part of the lead conductive cap 128. The thickness of the nickel layer 302 is in the range of 2.55 µm-8.00 µm. The nickel layer 302 can be deposited directly on the copper of the lead body 122 at the lead top side 126 and at the lead bottom side 124. The palladium layer 304 can be formed on the nickel layer 302.

The palladium layer 304 is defined as a layer of palladium that can compose a part of the lead conductive cap 128. The thickness of the palladium layer 304 is in the range of 0.020 μm to 0.152 μm. The palladium layer 304 can be deposited on the nickel layer 302 at the lead top side 126 and the lead bottom side 124 with the nickel layer 302 between the lead body 122 and the palladium layer 304. The gold layer 306 can be formed on the palladium layer 304.

The gold layer 306 is defined as a layer of gold that can compose a part of the lead conductive cap 128. The thickness of the gold layer 306 can be at least 0.003 μm. The gold layer 306 can be deposited on the palladium layer 304 at the lead top side 126 and the lead bottom side 124 with the palladium layer 304 between the gold layer 306 and the nickel layer 302.

The lead 120 can include a lead lower cap side 308 and a lead upper cap side 310 above the lead lower cap side 308. The lead lower cap side 308 is defined as a non-horizontal side of the lead conductive cap 128 with a surface extending from the lead lower concave side 130 to the lead bottom side 124. The lead lower cap side 308 is composed of the nickel layer 302, the palladium layer 304, and the gold layer 306.

The lead upper cap side 310 is defined as a non-horizontal side of the lead conductive cap 128 with a surface extending from the lead upper concave side 132 to the lead top side 126. The lead upper cap side 310 is composed of the nickel layer 302, the palladium layer 304, and the gold layer 306.

The paddle conductive cap 110 of FIG. 1 of the package paddle 102 of FIG. 1 can also include sidewalls that are composed of the nickel layer 302, the palladium layer 304, and the gold layer 306. The non-horizontal sides of the paddle conductive cap 110 are similar to the lead lower cap side 308 and the lead upper cap side 310. The lead body 122 can include the lead ridge 134 at the intersection of the lead lower concave side 130 of FIG. 1 and the lead upper concave side 132.

The integrated circuit packaging system 100 with a nickel layer 302 having a thickness between 2.55 μm-8.00 μm was compared to a prior art package system in a series of board level reliability tests. The prior art package system had a nickel thickness below 2.55 μm.

In a board level drop test, four boards with the integrated circuit packaging system and four boards with the prior art package system were subjected to thirty test drops. The purpose of the drop test was to establish confidence in the solder attachments between the packaged devices and the PCB board using the JESD22-B111 standard.

Units of the prior art package system failed as early as the first test drop and none of the units passed the test criteria after fifteen test drops. The drop test results for the integrated circuit packaging system 100 showed that all four boards passed the test criteria after thirty test drops.

The integrated circuit packaging system 100 and the prior art package system were also subjected to cyclic bending tests and thermal cycling tests. In the cyclic bending tests, the integrated circuit packaging system 100 showed an improvement of forty percent over the prior art packaging system in solder joint reliability. For thermal cycling tests, the integrated circuit packaging system 100 was projected to double reliability over prior art packaging systems.

It has been discovered that the lead conductive cap 128 with the nickel layer 302 having a thickness between 2.55 μm-8.00 μm provides a stronger junction for improving BLR cyclic bending performance by forty percent over prior art packaging systems. The discovery of the nickel layer 302 layer having a thickness between 2.55 μm-8.00 μm prevents a total consumption of pure nickel during conductive adhesive reflow resulting in a residual pure nickel region that forms a less brittle connection that will resist various BLR tests without breaking.

Further, it has been discovered that the lead conductive cap 128 with the nickel layer 302 between 2.55 μm-8.00 μm passes thirty drop tests whereas prior art packaging system fail after the first drop test.

Figure 4:
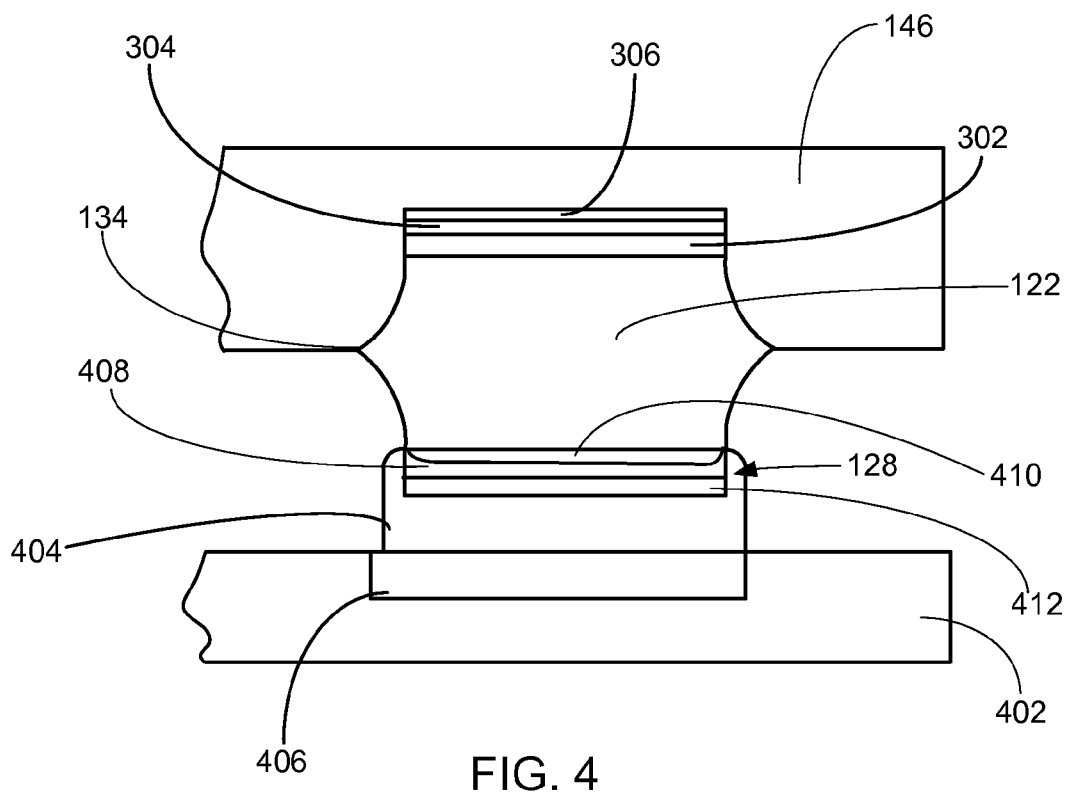
FIG. 4 is a detailed cross-sectional view of the structure in FIG. 3 attached to a next system level.

Referring now to FIG. 4, therein is shown a detailed cross-sectional view of the structure of FIG. 3 attached to a next system level 402. The next system level 402 is defined as a support structure, package, or device that can be attached to the integrated circuit packaging system 100. For example the next system level 402 can be a PCB or an integrated circuit device. The integrated circuit packaging system 100 can be mounted to the next system level 402 by a conductive adhesive 404.

The conductive adhesive 404 is defined as a conductive coupling structure for connecting the lead 120 to the next system level 402. The conductive adhesive 404 can preferably be composed of tin (Sn) but can also be silver or another metal alloy. The conductive adhesive 404 can surround the lead conductive cap 128 along the lead lower cap side 308 of FIG. 3 and at the lead bottom side 124 of FIG. 3. The conductive adhesive 404 can be used to mount the integrated circuit packaging system 100 to a contact pad 406 embedded on the next system level 402.

During reflow of the conductive adhesive 404, portions of the nickel layer 302, the palladium layer 304, and the gold layer 306 form intermetallic regions. The conductive adhesive 404 reflows and alters a portion of the nickel layer 302 to become a tin-nickel intermetallic region 408. The tin-nickel intermetallic region 408 is defined as a region of tin and nickel that is formed during the reflow of the conductive adhesive 404 for mounting the integrated circuit packaging system 100.

The nickel layer 302 includes a pure nickel inner region 410, which is defined as an inner region within the nickel layer 302 that is not completely altered by the tin-nickel intermetallic region 408. The increased thickness of the nickel layer 302 between 2.55 μm-8.00 μm preserves the pure nickel inner region 410 from the conductive adhesive 404 during reflow. The pure nickel inner region 410 is formed between the copper of the lead body 122 and the tin-nickel intermetallic region 408. The pure nickel inner region 410 can be between 0.05 μm-6.00 μm after reflow.

The pure nickel inner region 410 compensates for brittle nickel-tin, which is the weakness of solder joints formed from nickel-tin intermetallics. The pure nickel inner region 410 is less brittle and increases SJR because the solder joints are less prone to fracture and break. The pure nickel inner region 410 improves the pass rate of the integrated circuit packaging system 100 by forty percent in BLR thermal cycling tests.

During conductive adhesive reflow, the palladium layer 304 and the gold layer 306 and the conductive adhesive 404 form a Tin-Palladium-Gold (Sn—Pd—Au) intermetallic region 412. The Sn—Pd—Au intermetallic region 412 is defined as region of tin, palladium, and gold that is created during the reflow of the conductive adhesive 404 for mounting the integrated circuit packaging system 100.

The integrated circuit packaging system 100 with a nickel thickness between 2.55 μm-8.00 μm was compared to a prior art package system in a series of board level reliability tests. The prior art package system had a nickel thickness below 2.55 μm.

In a board level drop test, four boards with the integrated circuit packaging system and four boards with the prior art package system were subjected to thirty test drops. The purpose of the drop test was to establish confidence in the conductive adhesive 404/solder attachments between the packaged devices and the PCB board using the JESD22-B111 standard.

Units of the prior art package system failed as early as the first test drop and none of the units passed the test criteria after fifteen test drops. The drop test results for the integrated circuit packaging system 100 showed that all four boards passed the test criteria after thirty test drops.

The integrated circuit packaging system 100 and the prior art package system were also subjected to cyclic bending tests and thermal cycling tests. In the cyclic bending tests, the integrated circuit packaging system 100 showed an improvement of forty percent over the prior art packaging system in solder joint reliability. For thermal cycling tests, the integrated circuit packaging system 100 was projected to double reliability over prior art packaging systems.

It has been discovered that the lead conductive cap 128 with the nickel layer 302 having a thickness between 2.55 μm-8.00 μm preserves the pure nickel inner region 410 for a stronger junction of a forty percent improvement in BLR cyclic bending performance over prior art packaging systems. The discovery of the preservation of the pure nickel inner region 410 provides a less brittle junction between the lead 120 and the next level system 402.

The discovery of the nickel layer 302 having the thickness between 2.55 μm-8.00 μm prevents a total alteration of nickel during reflow of the conductive adhesive 404, resulting in the pure nickel inner region 410 that forms a stronger less brittle connection that will resist various BLR test without breaking The residual thickness range of the pure nickel inner region 410 was between 0.05 μm to 6.00 μm. Thus, the integrated circuit packaging system 100 passes thirty drops tests whereas prior art packaging systems fail after the first drop test.

Figure 5:
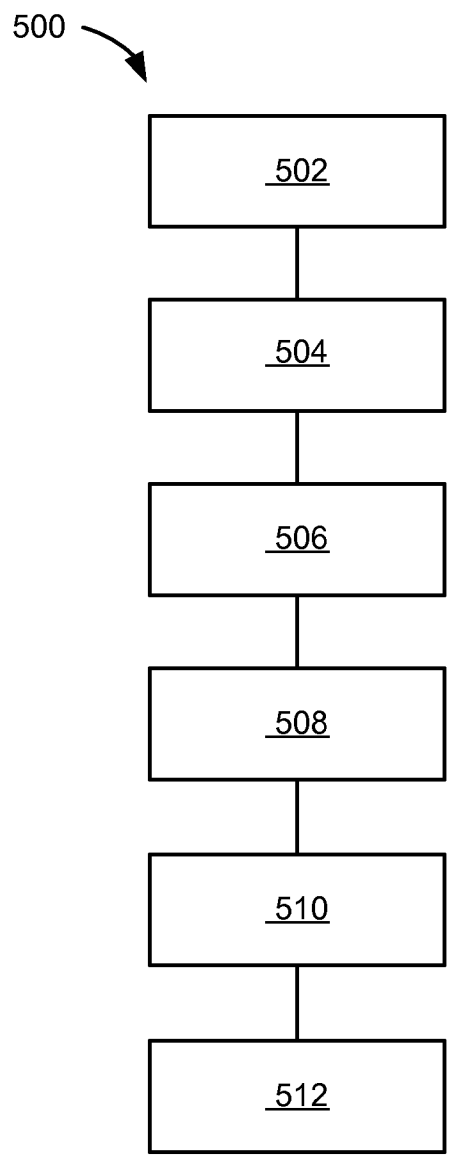
FIG. 5 is a flow chart of a method of manufacture of the integrated circuit packaging system in a further embodiment of the present invention.

Referring now to FIG. 5, therein is shown a flow chart of a method 500 of manufacture of the integrated circuit packaging system 100 in a further embodiment of the present invention. The method 500 includes: forming a package paddle in a block 502; forming a lead adjacent to the package paddle in a block 504; depositing a lead conductive cap on the lead, the lead conductive cap includes a nickel layer having a thickness between 2.55 μm to 8.00 μm deposited on the lead, a palladium layer deposited on the nickel layer, and a gold layer deposited on the palladium layer in a 506; mounting an integrated circuit over the package paddle in a block 508; attaching an electrical connector between the lead conductive cap and the integrated circuit in a block 510; and forming an encapsulation over the integrated circuit, a portion of the lead, and a portion of the package paddle in a block 512.

Thus, it has been discovered that the integrated circuit packaging system of the present invention furnishes important and heretofore unknown and unavailable solutions, capabilities, and functional aspects for mold interlock. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance. These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
    forming a package paddle having a paddle recess and a paddle bottom side, the paddle recess forms non-horizontal sidewalls into the package paddle, the non-horizontal sidewalls are perpendicular to the paddle bottom side;
    forming a lead adjacent to the package paddle;
    forming a lead conductive cap, having a pure nickel inner region with a thickness between 0.05 μm to 6.00 μm and having a tin-palladium-gold intermetallic region, on the lead including:
        depositing a nickel layer having a thickness between 2.55 μm to 8.00 μm on the lead,
        depositing a palladium layer on the nickel layer, and
        depositing a gold layer on the palladium layer;
    mounting an integrated circuit over the package paddle;
    attaching an electrical connector between the lead conductive cap and the integrated circuit; and
    forming an encapsulation over the integrated circuit, a portion of the lead, and a portion of the package paddle.

2. The method as claimed in claim 1 further comprising depositing a paddle conductive cap at the paddle bottom side and at a paddle top side of the package paddle, the paddle conductive cap includes the nickel layer having the thickness between 2.55 μm to 8.00 μm.

3. The method as claimed in claim 1 wherein depositing the lead conductive cap includes:
    forming the palladium layer having the thickness between 0.020 μm to 0.152 μm; and
    forming the gold layer having the thickness of at least 0.003 μm.

4. The method as claimed in claim 1 further comprising depositing a paddle conductive cap, the paddle conductive cap includes the nickel layer having the thickness between 2.55 μm to 8.00 μm, the palladium layer having the thickness between 0.020 μm to 0.152 μm, and the gold layer having the thickness of at least 0.003 μm.

5. The method as claimed in claim 1 wherein:
    mounting the integrated circuit includes mounting the integrated circuit within the paddle recess.

6. A method of manufacture of an integrated circuit packaging system comprising:
    forming a package paddle having a paddle recess and a paddle bottom side, the paddle recess forms non-horizontal sidewalls into the package paddle, the non-horizontal sidewalls are perpendicular to the paddle bottom side;
    forming a lead adjacent to the package paddle;
    forming a lead conductive cap, having a pure nickel inner region with a thickness between 0.05 μm to 6.00 μm and having a tin-palladium-gold intermetallic region, on the lead including:
        depositing a nickel layer having a thickness between 2.55 μm to 8.00 μm on the lead,
        depositing a palladium layer with the thickness between 0.020 μm to 0.152 μm on the nickel layer, and depositing a gold layer having the thickness of at least 0.003 µm deposited on the palladium layer;

mounting an integrated circuit over the package paddle;

connecting an electrical connector to the lead conductive cap and the integrated circuit; and forming an encapsulation over the integrated circuit, a portion of the lead, and a portion of the package paddle.

7. The method as claimed in claim 6 wherein forming the lead conductive cap includes forming a tin-nickel intermetallic region.

8. The method as claimed in claim 6 wherein depositing the lead conductive cap includes depositing the lead conductive cap at a lead top side and at a lead bottom side of the lead.

9. The method as claimed in claim 6 wherein connecting the electrical connector includes connecting the electrical connector to the paddle conductive cap and the integrated circuit.

10. The method as claimed in claim 6 wherein forming the package paddle includes forming a paddle ridge at an intersection of the paddle lower concave side and the paddle upper concave side.

11. An integrated circuit packaging system comprising:
a package paddle having a paddle recess and a paddle bottom side, the paddle recess forms non-horizontal sidewalls into the package paddle, the non-horizontal sidewalls are perpendicular to the paddle bottom side;
a lead adjacent to the package paddle;
a lead conductive cap on the lead, the lead conductive cap includes a tin-palladium-gold intermetallic region and a nickel layer having a pure nickel inner region with a thickness between 0.05 µm to 6.00 µm formed on the lead, the tin-palladium gold intermetallic region includes a palladium layer deposited on the nickel layer, and a gold layer deposited on the palladium layer;
an integrated circuit over the package paddle;
an electrical connector attached between the lead conductive cap and the integrated circuit; and
an encapsulation over the integrated circuit, a portion of the lead, and a portion of the package paddle.

12. The system as claimed in claim 11 further comprising a paddle conductive cap at the paddle bottom side and at a paddle top side of the package paddle, the paddle conductive cap includes the nickel layer having the thickness between 2.55 µm to 8.00 µm.

13. The system as claimed in claim 11 wherein the lead conductive cap includes:
the palladium layer having the thickness between 0.020 µm to 0.152 µm; and
the gold layer having the thickness of at least 0.003 µm.

14. The system as claimed in claim 11 further comprising a paddle conductive cap, the paddle conductive cap includes the nickel layer having a thickness between 2.55 µm to 8.00 µam, the palladium layer having the thickness between 0.020 µm to 0.152 µm, and the gold layer having a thickness of at least 0.003 µm.

15. The system as claimed in claim 11 wherein:
the integrated circuit is mounted within the paddle recess.

16. The system as claimed in claim 11 wherein the palladium layer has the thickness between 0.020 µm to µm and the gold layer has the thickness of at least 0.003 µm.

17. The system as claimed in claim 16 wherein the lead conductive cap includes a tin-nickel intermetally region.

18. The system as claimed in claim 16 wherein the lead includes a lead conductive cap at a lead top side and a lead bottom side of the lead.

19. The system as claimed in claim 16 wherein the electrical connector is attached between the paddle conductive cap and the integrated circuit.

20. The system as claimed in claim 16 wherein the package paddle includes a paddle ridge at an intersection of the paddle lower concave side and the paddle upper concave side.

* * * * *